United States Patent [19]

Peiffer

[11] Patent Number: 5,087,549

[45] Date of Patent: Feb. 11, 1992

[54] IMAGE REPRODUCTION PROCESS USING A PEEL-APART PHOTOSENSITIVE ELEMENT

[75] Inventor: Robert W. Peiffer, Newark, Del.

[73] Assignee: E. I. Du Pont de Nemours and Company, Wilmington, Del.

[21] Appl. No.: 600,474

[22] Filed: Oct. 19, 1990

[51] Int. Cl.⁵ .................. G03C 5/54; G03C 1/727; G03C 11/20; G03F 7/26
[52] U.S. Cl. ............................. 430/253; 430/257; 430/262; 430/263; 430/291; 430/912
[58] Field of Search ................. 430/253, 291, 912

[56] References Cited

U.S. PATENT DOCUMENTS

| | | | |
|---|---|---|---|
| 3,202,508 | 8/1965 | Hieart | 430/253 |
| 3,353,955 | 11/1967 | Colgrove | 430/253 |
| 3,615,435 | 10/1971 | Chu et al. | 430/253 |
| 4,050,936 | 9/1977 | Takeda et al. | 430/253 |
| 4,247,619 | 1/1981 | Cohen et al. | 430/253 |
| 4,304,839 | 12/1981 | Cohen et al. | 430/253 |
| 4,504,571 | 3/1985 | Yamamura et al. | 430/253 |
| 4,849,322 | 7/1989 | Bauer et al. | 430/912 |

*Primary Examiner*—Richard L. Schilling

[57] ABSTRACT

Provided are multilayer, tonable peel-apart photosensitive elements which include an esterified polyol plasticizer in the photoadherent layer, together with processes for their use for preparing pre-press color proofs.

27 Claims, No Drawings

IMAGE REPRODUCTION PROCESS USING A PEEL-APART PHOTOSENSITIVE ELEMENT

FIELD OF THE INVENTION

This invention relates to peel-apart photosensitive elements and image reproduction processes particularly useful for color proofing applications. More particularly, it relates to a process which uses a peel-apart photosensitive element comprising a strippable coversheet, a photoadherent layer, a non-photosensitive tonable contiguous layer, optionally an adhesive transition layer, and a support, to produce a negative image of the exposure transparency on the tonable contiguous layer.

BACKGROUND OF THE INVENTION

Photosensitive elements which can be used in image-reproduction processes are well-known in the graphics arts industry. Such elements are exposed to actinic radiation, usually through an image-bearing transparency such as a color separation transparency, to produce an image which is either positive or negative with respect to the transparency used. Positive-working elements produce a duplicate image with respect to the transparency used for exposure. Negative-working elements produce an image that is the reverse of the transparency through which they are exposed.

After imagewise exposure, the photosensitive elements may be developed in a variety of ways, e.g., by washout of soluble image areas, application of colorant material which adheres to the tacky image areas, peeling apart of photoadherent layers, or combinations of these techniques. The resulting image-bearing photosensitive elements are particularly useful for color proofing applications. A useful reference for color proofing methods is *Principles of Color Proofing*, by Michael H. Bruno, GAMA Communications, Salem, NH, 1986.

Cohen and Fan, U.S. Pat. No. 4,174,216, describe negative-working photosensitive elements which can be used to produce colored images by a dry process in which a colorant material is applied to develop the image. The element comprises, in order from top to bottom, a strippable coversheet, a photoadherent layer, an essentially nonphotosensitive tonable contiguous layer, and a support. After imagewise exposure to actinic radiation through the coversheet, the element can be developed by peeling off the coversheet and applying colorant material. The areas of the photoadherent layer which have been exposed to actinic radiation adhere to and are removed with the coversheet thus uncovering the underlying tonable contiguous layer in those areas. The unexposed areas of the photoadherent layer remain on the supported tonable contiguous layer. When the colorant material is applied it adheres selectively to the uncovered areas of the tonable contiguous layer, corresponding to the exposed areas, and does not adhere to the remaining areas of the photoadherent layer. Thus a colored image which is the reverse of the transparency used for exposure is formed. By repeating this process several times, each time using a new element and a different color separation transparency, and toning with the corresponding colorant, it is possible to build up a multicolored surprint proof.

While the above process yields image reproductions with high resolution in a fast and economical way, the reproductions sometimes exhibit defects known as "fine toned line defects". These are random defects that appear as very thin lines of color where there should be no color. A fine toned line defect can make the image unusable, especially if it occurs in a critical area, e.g., a face or a clear background area. An entire multilayer, multicolor proof can be ruined if the final toned layer has fine toned line defects in a critical area. As thinner photopolymer layers are used in order to improve resolution, fine toned line defects become even more numerous.

Fine toned line defects are thought to be caused by microscratches on the coversheet of the photosensitive element. The scratches, probably caused by abrasion of the coversheet and/or the photosensitive film layer during the manufacturing process, are only about a micron ($\mu$m) wide. However, during the peel-apart step, these micron-wide scratches cause strips of unexposed photopolymer about 20 microns in width to be peeled off with the coversheet. During the subsequent toning step, the areas where strips of unexposed photopolymer have been removed will accept toner and thus appear as colored lines.

Attempts to eliminate fine toned line defects by eliminating all scratches on the coversheet films have been largely unsuccessful. It is extremely difficult to eliminate all sources of dust and other contaminants which may scratch the surface of the coversheet film in any one of several processing steps. Therefore, other avenues must be explored to achieve a multilayer peel-apart photosensitive element which does not exhibit fine toned line defects.

SUMMARY OF THE INVENTION

The invention relates to a process for preparing a toned image useful in a pre-press color proof, said process comprising the steps of:
(A) providing a multilayer peel-apart photosensitive element comprising, in order from top to bottom:
  (1) a strippable coversheet which is transparent to actinic radiation,
  (2) a photoadherent layer consisting essentially of:
    (a) an addition polymerizable, unsaturated monomer;
    (b) an initiator system activatable by actinic radiation;
    (c) an organic polymeric binder; and
    (d) about 3 to about 15% by weight of at least one esterified polyol plasticizer which is an ester of a polyol of two to five carbon atoms and one or more aliphatic saturated organic acids,
  (3) an essentially nonphotosensitive tonable organic contiguous layer, and
  (4) a removable support sheet, wherein after imagewise exposure to actinic radiation, the coversheet may be peeled from the element with the exposed areas of the photoadherent layer adhering thereto, while the unexposed areas of the photoadherent layer remain on the contiguous layer, and wherein the unexposed areas of the photoadherent layer do not accept toning material under a condition whereunder the contiguous layer may be toned;
(B) imagewise exposing the element to actinic radiation;
(C) peeling the strippable coversheet from the photoadherent layer,
(D) applying a toning material to the surface of the photoadherent layer; and, (E) removing excess toning material; whereby the number of fine toned line defects in the resulting image is reduced.

The invention also relates to peel-apart photosensitive elements as described above, wherein the photoadherent layer comprises about 3 to about 15% by weight of at least one esterified polyol plasticizer which is an ester of a polyol of two to five carbon atoms and one or more aliphatic saturated organic acids.

In a preferred process of the invention the removable support sheet is stripped from the photosensitive element and the element, minus the removable support, is adhered to a receptor sheet prior to imagewise exposure in step (B). After imagewise exposure, peeling apart, and toning, the removable support sheet is removed from another photosensitive element and the second element, minus the removable support, is laminated on top of the toned image formed in steps (D) and (E). Process steps (B) through (E) are repeated with the new element. In step (B) second the element is exposed in register through a different color separation transparency, and in step (D) the correspondingly colored toning material is applied. This process may be repeated a plurality of times, each time using a new element, a different color separation transparency and the corresponding colorant, to produce a multilayer, multicolored surprint proof.

DETAILED DESCRIPTION OF THE INVENTION

The invention relates to a dry, peel-apart process for preparing a colored image on a photosensitive element. The photosensitive element comprises a strippable coversheet, a photoadherent layer, an essentially non-photosensitive tonable organic contiguous layer, and a support sheet. The process includes the steps of imagewise exposing to actinic radiation, peeling off the coversheet, and applying colorant material, i.e., toning. Such toned peel-apart elements have been found to be subject to fine toned line defects. Attempts to eliminate fine toned line defects by eliminating all scratches on the coversheet films have been largely unsuccessful. Surprisingly, however, it has been found that it is possible to reduce the number of fine toned line defects in the final image by adding to the photoadherent layer one or more simple esters of polyols of two to five carbon atoms.

The photoadherent layer, which is the sole photosensitive layer of the element, is one whose adhesive relationship vis-à-vis the coversheet and the tonable contiguous layer is altered by exposure to actinic radiation. In peel-apart photosensitive elements useful in the process of the invention, as described for example, in U.S. Pat. No. 4,174,216, after imagewise exposure to actinic radiation, the coversheet may be peeled from the element with the exposed areas of the photoadherent layer adhering thereto, while the unexposed areas of the photoadherent layer remain on the contiguous layer.

In a negative-working tonable peel-apart element such as those taught in U.S. Pat. No. 4,247,619, before exposure the photoadherent layer adheres more strongly to the tonable contiguous layer than to the coversheet. If the unexposed element is peeled apart, the photoadherent layer remains on the contiguous layer. However, after imagewise exposure of the element, the exposed, i.e., photohardened areas of the photoadherent layer adhere more strongly to the coversheet than to the contiguous layer and are removed with the coversheet. The unexposed areas of the photoadherent layer, which adhere more strongly to the contiguous layer than to the coversheet, will remain on the contiguous layer when the coversheet is peeled off.

Materials with ethylenically unsaturated groups which are photohardenable, photopolymerizable, photocrosslinkable, and/or photodimerizable, are used in the photoadherent layer. The preferred photohardenable compositions of the invention are photopolymerizable, and comprise a macromolecular organic polymeric binder, an addition polymerizable ethylenically unsaturated monomer, a photoinitiator system which initiates free radical addition polymerization upon exposure to actinic radiation, and one or more simple esters of polyols of two to five carbon atoms.

While it has been disclosed previously that photohardenable layers may contain plasticizers, for example in Burg, U.S. Pat. No. 3,192,194; Heiart, U.S. Pat. No. 3,202,508; Collins et al., U.S. Pat. No. 3,615,937, these references pertain to single layer photosensitive elements, not complex multilayer peel-apart elements. Single layer elements, which typically comprise a coversheet, a photosensitive layer, and a support, function differently from multilayer peel-apart elements and do not require the very exacting balance of adhesive/cohesive forces in order to function properly, as with multilayer peel-apart photosensitive elements. Moreover, a scratch on the coversheet of such a single layer element would not result in a fine toned line defect.

In U.S. Pat. Nos. 4,734,356 and 4,849,322, it was taught that a plasticizer mixture of triacetin and trimethylolpropane could be added to the photosensitive layer of a single-layer element to reduce the temperature dependence of toning. This particular teaching is irrelevant to a peel-apart element wherein it is the contiguous layer rather than the photosensitive layer that is toned to visualize the image. Moreover, it is recognized that any change in the formulation of a multilayer peel-apart photosensitive element will have unexpected and frequently deleterious effects.

Although it has also been disclosed generally that plasticizers may be added to the photosensitive layer of multilayer peel-apart photosensitive elements (for example, in Cohen and Fan, U.S. Pat. No. 4,304,839), such references do not suggest the addition of a plasticizer to reduce fine toned line defects. Nor is there any teaching of the amount or type of plasticizer that should be used, much less any teaching or suggestion that esterified polyol plasticizers of the invention can be used in such elements. The addition of some plasticizers can result in poor image quality or even no image at all due to their adverse effect on the balance of adhesive/cohesive forces in the peel-apart photosensitive element. If too little plasticizer is added there may be no effect on the number of fine toned line defects. If too much plasticizer is added the image quality may be adversely affected. Unexpectedly, it has been found that about 3 to about 15% by weight of one or more plasticizers, each of which is a polyol of two to five carbon atoms esterified with one or more aliphatic saturated organic acids, added to the photoadherent layer of a peel-apart element reduces the incidence of fine toned line defects.

The term polyol is intended to means a compound having an aliphatic hydrocarbon backbone with at least two hydroxyl substituents. Examples of suitable plasticizers which are polyols of two to five carbon atoms esterified with one or more aliphatic saturated organic acids include the acetate, propionate, and butyrate esters of ethylene glycol (1,2-ethanediol) and glycerol (1, 2, 3-propane triol). The acid(s) and the polyol will be chosen so that the esterified polyol functions as a plasticizer, e.g., lowers the Tg of the photohardenable composition, or otherwise modifies its properties to achieve the desired effect. Preferred polyol esters are fully esterified, i.e., the diesters of ethylene glycol or the triesters of glycerol. Partially esterified polyols are less effective. Suitable esters of glycerol include the mono-, di-and triacetate esters, the mono-, di- and tri-propionate esters, and the mono-, di- and tributyrate esters, including the 1-propionate, 2-propionate, 2-butyrate, and tert-butyrate esters, etc. Preferred acid esterifying groups are aliphatic saturated organic acids of two to four carbon atoms. Unesterified polyols, e.g., glycerol or trimethylolpropane, do not reduce fine toned line defects. Specifically preferred polyol esters are the triacetate and the tributyrate esters of glycerol, or triacetin and tributyrin, respectively. The polyol ester is present in an amount of from about 3 to about 15% by weight based on the total weight of the photoadherent layer, preferably about 5 to about 7% by weight. A suitable plasticizer must be non-photoreactive so that it serves to modify the properties of both the exposed and unexposed photoadherent layer.

The binder in the photoadherent layer is a macromolecular organic polymer or mixture of polymers. The binder must be compatible with the monomer; that is, the photohardenable composition must provide a film which is free of haze, streaks or mottling, both before and after exposure. It must also provide the proper adhesion balance between the photoadherent layer and the two adjacent layers (the coversheet and the organic contiguous layer), as well as the proper degree of internal cohesion. The binder can be a polar material, such as an acidic polymer containing at least 1.5 mole percent free acid groups to impart polarity to the polymer, or a nonpolar material, e.g., materials as described in Burg et al., U.S. Pat. No. 3,060,023, Chu et al., U.S. Pat. No. 3,649,268 and Collier et al., U.S. Pat. No. 3,984,244. Examples of suitable binders include polyvinylformal; polyvinyl butyral; polyvinyl acetate; polyurethane esters; polymethylmethacrylate; and copolymers of acrylate and/or methacrylate esters. A preferred binder is polymethylmethacrylate.

The monomer which can be used in the photohardenable layer has at least one and preferably two or more terminal ethylenically unsaturated groups capable of free-radical initiated, chain propagated, addition polymerization, and preferably has some degree of polarity. In addition, the monomer must be compatible with the binder and substantially nondiffusible into the tonable organic contiguous layer. Among the ethylenically unsaturated monomers which have been found useful are those disclosed in Plambeck, U.S. Pat. No. 2,760,863; Cohen and Schoenthaler, U.S. Pat. No. 3,380,831; and Chambers and Woodward, U.S. Pat. No. 3,563,918. Also useful are epoxy monomers containing ethylenic unsaturation of the type disclosed in U.S. Pat. No. 3,661,576 and British Pat. No. 1,006,587. Preferred monomers are the diacrylate and dimethacrylate esters of bisphenol A/epichlorohydrin epoxy resin. It will be understood that a single monomer or a mixture of monomers can be used, and that compounds that may not be strictly monomers in the usual sense, e.g., dimers, may be used in some compositions.

The initiator system comprises one or more compounds which directly furnish free radicals when activated by actinic radiation. It can also comprise a plurality of compounds, one of which yields the free radicals after having been caused to do so by another compound, or sensitizer, which has been activated by the radiation. By "actinic radiation" is meant radiation which is active to produce the free radicals necessary to initiate polymerization of the monomeric material.

Preferred initiator systems are 2,4,5-triphenylimidazolyl dimers in combination with chain transfer agents, or hydrogen donors, and mixtures thereof, as described in U.S. Pat. Nos. 3,427,161, 3,479,185, 3,549,367, 4,311,783, 4,622,286 and 3,784,557. Useful 2,4,5-triarylimidazolyl dimers are disclosed in Baum et al., U.S. Pat. No. 3,652,275, Col. 5,1.44 to Col. 7,1. 16. Preferred hexaarylbisimidazoles (HABI's) are 2-o-chlorosubstituted hexaphenylbiimidazoles in which the other positions on the phenyl radical are unsubstituted or substituted with chloro, methyl or methoxy. The most preferred initiator is o-Cl-HABI, i.e., 2,2'bis (o-chlorophenyl)-4,4',5,5'-tetraphenyl-1,1'-biimidazole, which is typically used with a hydrogen donor.

Sensitizers useful with these photoinitiators include methylene blue, as well as sensitizers disclosed in U.S. Pat. Nos. 3,554,753; 3,563,750; 3,563,751; 3,647,467; 3,652,275; 4,162,162; 4,268,667; 4,351,893; 4,454,218; 4,535,052 and 4,565,769. For some applications, such as color proofing, the use of sensitizing dyes, especially those whose absorption extends well into the visible region of the spectrum, may be undesirable since such dyes may affect the color of the resulting image. A preferred sensitizer is 3-phenyl-7-[2'-(4'-N,N-diethylamino-6'-chloro-1',3',5'-triazinylamino]coumarin.

Hydrogen donor compounds useful as chain transfer agents in the photohardenable layer include: 2-mercaptobenzoxazole; 2-mercaptobenzothiazole; 4-methyl-4H-1,2,4-triazole-3-thiol; and the like, as well as various types of compounds, e.g., (a) ethers, (b) esters, (c) alcohols, (d) compounds containing allylic or benzylic hydrogen, (e) acetals, (f) aldehydes, and (g) amides as disclosed in Col. 12, lines 18 to 58 of MacLachlan, U.S. Pat. No. 3,390,996, the teaching of which is hereby incorporated by reference. A preferred hydrogen donor is 2-mercaptobenzoxazole.

Although the HABI initiating systems described above are preferred, there are also many other initiating systems which may be used in the practice of this invention. Typical free radical-generating addition polymerization initiators include: quinones; ketones, such Michler's ketone and benzophenone; dialkylamino benzaldehyde; benzaldehyde; dialkylamino benzoate esters; and combinations thereof. Other useful photoinitiators, described in U.S. Pat. No. 2,760,863, include vicinal ketaldonyl alcohols, such as benzoin, pivaloin, acyloin ethers, e.g., benzoin methyl and ethyl ethers; alpha-hydrocarbonsubstituted aromatic acyloins, such as alpha-methylbenzoin.

Redox systems, such as those involving dyes, e.g., Rose Bengal/2-dibutylaminoethanol, may be used. A useful discussion of dye sensitized photopolymerization can be found in "Dye Sensitized Photopolymerization" by D. F. Eaton in *Adv. in Photochemistry*, Vol. 13, D. H. Volman, G. S. Hammond, and K. Gollinich, eds., Wiley-Interscience, New York, 1986, pp. 427–487. For some applications, such as color proofing, the use of dye-based initiator systems, especially those which use dyes whose absorption extends well into the visible region of the spectrum, may be undesirable since such dyes may affect the color of the resulting image.

The photoadherent layer may also contain other ingredients which are conventional components used in photohardenable systems subject to the conditions that they (1) must be compatible with the other ingredients present in the photoadherent layer and (2) do not alter the unique relationship of cohesive/adhesive forces between and within the unexposed and exposed photoadherent layer, and the coversheet required for the practice of this invention. Such components may include stabilizers, antihalation agents, optical brightening agents, release agents, surfactants, coating aids, and the like.

Normally a thermal polymerization inhibitor will be present to increase storage stability of the photohardenable composition. Useful thermal stabilizers include hydroquinone, p-methoxyphenol, alkyl- and aryl-substituted hydroquinones and quinones, tert-butyl catechol, pyrogallol, β-naphthol, 2,6-di-tert-butyl p-cresol, 2,4,6-tri-tert-butyl phenol, phenothiazine, and p-toluquinone. The dinitroso dimers described in Pazos, U.S. Pat. No. 4,168,982, may also be useful. Since commercial monomers generally contain thermal polymerization inhibitors added by their manufacturers, it is frequently unnecessary to add additional inhibitor.

Nonionic surfactants may be added to the photoadherent layer as a coating aid. Preferred coating aids are polyethylene oxide, such as Polyox ® WSRN 3000, and fluorinated nonionic surfactants, such as Fluorado ® FC-430.

By the incorporation of optical brightening agents into the photohardenable layer, the image record is produced free from distortion due to halation effects. Suitable optical brighteners useful in the process of the invention include those disclosed in U.S. Pat. Nos. 2,784,183, 3,664,394, and 3,854,950. Specific optical brighteners which are particularly useful in photohardenable layers are 2-(stibyl-4")-(naphtho-1',2',4,5)-1,2,3-triazol-2"-sulfonic acid phenyl ester and 7-(4'-chloro-6'-diethylamino-1',2',5'-triazine-4'-yl)-amino-3-phenyl coumarin. Ultraviolet radiation absorbing materials useful in the invention are also disclosed in U.S. Pat. No. 3,854,950.

The ratio of binder to monomer may vary widely, but in general should be in the range of 3:1 to 1:3. The monomer should be compatible with, and may be a solvent for, and/or have a plasticizing action on the binder. The choice and proportions of monomer and binder are made in accordance with the requirements of selective photoadhesion and hardness. In order to provide a suitable hardness, the monomer concentration is normally kept low so that the photohardenable layer coated from the composition will be sufficiently hard and nontacky.

For the photoadherent layer of the invention, the preferred photohardenable composition will normally contain, based on total weight of the photohardenable layer: 35–50% binder, 35–50% monomer, 1–5% 2,4,5-triphenylimidazolyl dimer, 1–2% chain transfer agent, 0–1.0% sensitizer, and about 3 to about 15% by weight of one or more simple ester of a polyol of two to five carbon atoms, and 0–15% other ingredients.

The coating weight of the photohardenable composition is generally in the range from 10–100 mg/dm$^2$ providing a dry layer thickness of about 0.03–0.33 mils (0.00076–0.008 mm). It is particularly preferred to have a coating weight less than of about 35 mg/dm$^2$ in order to provide a photoadherent layer with very high resolution.

The tonable organic contiguous layer is a tacky or slightly soft, deformable material. In a preferred embodiment of the invention the contiguous layer will consist essentially of an elastomeric material. For an element with good aging stability, suitable materials for the contiguous layer should resist monomer diffusion from the photoadherent layer into the contiguous layer. Particularly preferred materials are colorless and comprise elastomeric polymers or mixtures thereof having a second order transition temperature of −10° C. or less, which are inherently tacky. Preferred polymers are rubber types, both natural and synthetic, e.g. polyisobutylene, Thiokol A, nitrile rubbers, butyl rubber, chlorinated rubbers, polymers of butadiene, poly(vinylisobutyl-ether), polyisoprene and random, teleblock and block copolymers of butadiene or isoprene copolymerized with styrene; and neoprene, silicone elastomers, etc., in various proportions. The contiguous layer may also contain oxidation inhibitors, optical brighteners, UV absorbers, antihalation compounds and the like. A preferred oxidation inhibitor is tetrakis-[methylene-3-(3,5-di-tert-butyl-4'-hydroxyphenyl)propionate]methane which is preferably present at a level of 0.1 to 1% by weight.

The elements used in the process of this invention have a coversheet which is strippable, i.e., removable by peeling it apart from the rest of the element. The coversheet must be transparent to actinic radiation and is preferably oxygen impermeable. Preferred materials for the cover sheet are polymeric films, particularly polyester films such as polyethylene terephthalate, polyamide, polyimide, polystyrene, or polyolefin. A preferred cover sheet is polyethylene terephthalate which has been previously treated with an electric discharge to improve photoadhesion, as described in Buzzell, U.S. Pat. No. 4,356,253. The film can also be treated with a flame such as an air-propane flame.

While the thickness of the coversheet may be varied over a wide range, films having a thickness of 0.001 inch (0.025 mm) or less are particularly preferred for the production of negative surprint proofs. Thin coversheets produce halftone dots of good roundness with sharp edges. On the other hand, the coversheet should be thick enough so that electrostatic discharge or flame treatment will not injure it and so that it can be cleanly stripped from the element without tearing.

The contiguous layer is present on a support. The support can be any suitable film which has the necessary stiffness and dimensional stability and which exhibits proper adhesion to the elastomeric layer. Polyethylene terephthalate is preferred. For preparation of a surprint proof, a removable support is required. Silicone release treated polyethylene terephthalate is preferred for this application. The thickness of the support is generally not very critical. A typical support is from 1 to 5 mils (0.025 to 0.127 mm) in thickness.

The described multilayer photosensitive elements can be manufactured in several different ways. For example, the photoadherent layer can be coated from a solvent onto the coversheet. After the solvent has evaporated, a release film, such as polyethylene, may be temporarily placed over the coating to protect the photoadherent layer until the rest of the element is formed. The elastomeric layer can be coated from an appropriate solvent over the photoadherent layer. If a release film is present on the photoadherent layer, it must be stripped off before the elastomeric layer is coated. After the solvent has evaporated, the support can be laminated to the surface of the contiguous layer. It will be understood that the solvent for the contiguous layer should not have any solubilizing or deleterious effect on the photoadherent layer. Similarly, the solvent for the transition layer should not have any solubilizing or deleterious effect on either the photoadherent layer or the contiguous layer.

Another method for preparing the photosensitive element is to coat the photoadherent layer onto the coversheet and to coat the contiguous layer onto the support. After the solvent has evaporated, a release film, such as polyethylene, can be placed over the photoadherent and/or contiguous layers for protection until the rest of the element is formed. The supported photoadherent and contiguous layers can then be laminated together under pressure at room temperature or elevated temperature. If a release film is present, it must be stripped off before lamination.

The photoadherent layer and the contiguous layer can also be coated simultaneously onto the coversheet. The support can then be laminated to the contiguous layer. Alternatively, the photoadherent and the contiguous layer can be coated simultaneously onto the support. The coversheet can then be laminated to the photoadherent layer. All of these methods as well as other variations are known to those skilled in the art of coating multilayer films.

The photoadherent layer can be prepared by mixing the ingredients of the system in a solvent, such as methylene chloride, usually in the weight ratio of about 15:85 to 25:75 solids to solvent, coating onto the appropriate support, and evaporating the solvent. Care should be taken to provide a uniform coating. It is preferred that the coating weight be about 40 mg/dm$^2$ or less, generally providing a dry thickness of about 4 micrometers or less.

Any suitable solvent can be used to coat the contiguous layer. When the contiguous layer and photoadherent layer are coated simulataneously, the solvent must not cause significant migration of the components of the contiguous layer into the photoadherent layer. Coatings of the contiguous layer should be uniform and typically have a thickness of 3 to 15 micrometers, preferably 7 to 12 micrometers, when dry. Dry coating weights will be about 30 to 150 mg/dm$^2$. The contiguous layer may also be coated as a dispersion, e.g., an aqueous dispersion, with satisfactory results.

Any convenient source or sources of actinic radiation providing wavelengths in the region of the spectrum that overlap the absorption bands of the photoinitiator system can be used to active photohardening. The radiation can be natural or artificial, monochromatic or polychromatic, incoherent or coherent, and for high efficiency should correspond closely in wavelengths to those of the photoinitiator system. Since the photoadherent materials used in this invention usually exhibit their maximum sensitivity in the ultraviolet range, the light source should furnish an effective amount of this radiation. Such sources include carbon arcs, mercury-vapor arcs, fluorescent lamps with special ultraviolet-emitting phosphors, argon glow lamps, electronic flash units and photographic flood lamps. Useful coherent light sources are lasers whose emissions fall within or overlap the absorptions bands of the photoinitiator system. The exposure time required for satisfactory reproduction of a given element is a function of the photoadherent composition, type of light source used, and distance between light source and element.

At the present time, imagewise exposure is ordinarily carried out through a line or halftone image-bearing transparency, preferably a halftone color separation transparency. It is recognized, however, that other means, such as a modulated scanning laser beam, cathode ray tube, and the like, are alternative ways of imagewise exposing the elements of this invention.

After exposure to actinic radiation, the strippable coversheet is peeled off the photosensitive element, together with the exposed areas of the photoadherent layer. This leaves the contiguous layer uncovered in the image areas complementary to those removed with the coversheet. The image is then developed by applying a colorant material, generally known as a toner. Suitable colorants and toners used in color proofing processes of the invention are described in Chu and Manger, U.S. Pat. No. 3,620,726; Gray, U.S. Pat. No. 3,909,282; Manger, Fickes and Long, U.S. Pat. No. 4,214,193; and Cohen and Fan, U.S. Pat. No. 4,286,046. The toners may be applied by a dusting treatment similar to that disclosed in U.S. Pat. No. 3,060,024, or applied and distributed by means of a toner applicator as described in U.S. Pat. No. 4,087,278. The toners may also be applied by a transfer process as described in U.S. Pat. No. 3,060,025. The excess toner present on the photopolymer element is removed physically by soft materials of various types, e.g., silicone-treated cloth, absorbent cotton, and acrylic pile. Precolored toning films may also be used in preparing the image reproductions. Such toning films are described in Frohlich, U.S. Pat. No. 4,806,451.

In using the photosensitive elements of this invention to prepare surprint proofs from conventional negative halftone color separation transparencies, an element with a removable support sheet is used. The removable support is removed from a film element; the element, minus the removable support, is then adhered to a permanent support known as a receptor sheet. The resulting composite structure is exposed to actinic radiation through the coversheet using a color separation transparency. The color separation transparency will be a negative when the element is negative working. The coversheet is then peeled off of the exposed element at room temperature or an elevated temperature by stripping with a smooth, moderate to rapid continuous motion, preferably at an 180° peel angle. The element is then developed by applying toner of the color corresponding to the color separation transparency used in the exposure step. To form a multicolor surprint proof, another photosensitive element, minus its removable support, is adhered to the image thus prepared, exposed in register through a different color separation transparency, the coversheet removed as described above, and toner of a color corresponding to the second transparency is applied. This sequence of steps can be repeated as many times as desired. As a final protective layer, the surprint proof may also have a nonimaged photopolymer layer or element or a non-photosensitive protective covering of lower gloss, as described in Taylor, U.S. Pat. No. 4,921,776.

The receptor sheet is a material which is flat and preferably smooth, for example, films, e.g., polyethylene terephthalate of photographic grade which may be subbed as described in Alles, U.S. Pat. No. 2,779,684; adhesive subbed opaque polyethylene terephthalate film base, e.g., Melinex ® 994, sold by I.C.I. Americas, Wilmington, DE; and paper stock, e.g., Kromekote ® opaque white paper, Champion Paper Co., Stamford, CT, or Cromalin ® receptor stock, E. I. du Pont de Nemours & Company, Wilmington, DE. The preferred material is an opaque white paper.

The elements and processes of this invention are useful for preparing colored images. These images are particularly useful in the graphic arts field, especially in the area of color proofing wherein proofs are prepared to simulate the images produced by printing.

The advantageous properties of this invention can be observed by reference to the following examples which illustrate, but do not limit, the invention.

EXAMPLES

| Materials | |
|---|---|
| BD | poly(butadiene) |
| o-Cl-HABI | 2,2'-bis(o-chlorophenyl)-4,4',5,5'-tetraphenyl-1,1'-biimidazole |
| Irganox ® 1010 | tetrakis-[methylene-3-(3,5-di-tert-butyl-4'-hydroxyphenyl)propionate]-methane; Ciba-Geigy |
| 2-MBO | 2-mercaptobenzoxazole |
| MeCl | methylene chloride |
| MMA: | poly(methylmethacrylate), high molecular weight, inherent viscosity = 1.38 at 20°C., (0.25 g polymer in 50 ml of chloroform, No. 50 Cannon-Fenske Viscometer) |
| Monomer: | diacrylate ester of bisphenol A epoxy resin derived from bisphenol A and epichlorohydrin, viscosity (25° C.) = 1 × $10^6$ cps |
| PEG | poly(ethylene glycol), MW = 400,000 |
| PEO | poly(ethyleneoxide), MW = 400,000 |
| SB | styrene/butadiene copolymer(23.5/76.5) |
| Tinopal ® SFG | 3-phenyl-7-[2'-(4'-N,N-diethylamino-6'-chloro-1',3',5'-triazinylamino]-coumarin; Ciba-Geigy |
| Tinuvin ® 328 | 2-(2'-hydroxy-3',5'-di-tert-amylphenyl)-benzotriazole; Ciba-Geigy |

EXAMPLES 1-8

These examples illustrate the reduction in fine toned line defects when using the process of the invention.

A. Preparation of the Photoadherent Layer

The following ingredients were combined in the amounts indicated using the plasticizers given in Table 2:

TABLE 1

| Ingredient | Amount (g) |
|---|---|
| Monomer | 359.0 |
| MMA | 392.0 |
| o-Cl-HABI | 22.5 |
| 2-MBO | 13.5 |
| Tinopal ® SFG | 18.0 |
| PEG | 4.5 |
| Additive | 90.0 |
| MeCl | 2976.0 |
| Methanol | 124.0 |

TABLE 2

| Example | Additive[a] |
|---|---|
| 1 | Monoacetin |
| 2 | Diacetin |
| 3 | Triacetin |
| 4 | 1-Monobutyrin |
| 5 | Tributyrin |
| Comp. Ex. 6 | Glycerol |
| Comp. Ex. 7 | Dioctylphthalate |

TABLE 2-continued

| Example | Additive[a] |
|---|---|
| Comp. Ex. 8 | No additive |

[a]Monoacetin, diacetin, and triacetin are the mono-di-, and triacetate esters of glycerol, respectively. Monobutyrin and tributyrin are the mono- and tributyrate esters of glycerol, respectively.

The materials were thoroughly mixed and coated on a 0.48 mil (0.012 mm) thick transparent polyethylene terephthalate film, which had been previously treated with a high density electrical corona. The wet coating weight was about 30 mg/dm$^2$. The sample was allowed to air dry.

B. Preparation of the Organic Contiguous Layer

The following ingredients were combined in the amounts given:

TABLE 3

| Ingredient | Amount (g) |
|---|---|
| SB | 75.0 |
| BD | 670.0 |
| Irganox ® 1010 | 3.75 |
| Tinopal ® SFG | 1.5 |
| MeCl | 9250.0 |

The ingredients were throughly mixed and coated on a 0.92 mil (0.0234 mm) thick transparent polyethylene terephthalate support which had been previously coated with a silicone release coating. The wet coating weight was about 120 mg/dm$^2$. The sample was allowed to air dry.

C. Preparation of the Photosensitive Element

When the tonable contiguous layer from step B was dry, it was immediately laminated at room temperature to the photoadherent layer from step A with the photoadherent layer adjacent to the elastomeric layer.

D. Aging

The photosensitive element from step C was placed in an oven at 40° C. for one week to accelerate the formation of defects.

E. Exposure and Development

The photosensitive element from step D was laminated to Cromalin ® CR/1 receptor using the Cromalin ® Model 2700 Laminator, E.I. du Pont de Nemours and Company (Wilmington, DE). During the lamination process the silicone treated polyethylene terephthalate film was removed and the tonable contiguous layer placed in contact with the receptor. This sample was then placed in a Theimoplan vacuum frame from Exposure Systems Corp. (Bridgeport, CT) and the desired target transparency placed on the element. The frame was closed and, after applying a vacuum for about 90 seconds, the element was exposed for 40 to 60 units using a Violux exposure unit, Model 5002S from Exposure Systems Corp. (Bridgeport, CT) through a Kokomo filter No. 400, Kokomo Opalescent Glass Co. (Kokomo, IN). After exposure, the exposed laminated element was removed from the frame and placed on a Heated Peel Table, Model HTC 3145 from M. P. Goodkin Co. (Irvington, NJ), set to 80° F. and allowed to remain on the table for about 30 seconds. After this time the coversheet was removed with a quick uniform pull. The exposed areas adhered to the coversheet leaving the complementary areas of the elastomeric layer uncovered. The element was then developed with yellow toner using the ATM-2900 Autotoner Machine from E. I. du Pont de Nemours & Company (Wilmington, DE). A second aged photosensitive element was laminated to the developed image and the process repeated with different target transparencies and magenta, cyan and black toners. After the black layer was developed, a final layer of the film element was laminated to the multicolor image to protect the surface. The samples were then evaluated for image quality and fine toned line defects. The results are given in Table 4.

TABLE 4

| Example | Image Quality | Defect Level[b] |
|---------|---------------|----------------|
| 1 | weak | none |
| 2 | poorly formed | none |
| 3 | good | none |
| 4 | weak | none |
| 5 | good | low |
| 6 | none | — |
| 7 | good | low-medium |
| 8 | good | medium |

[b]Fine toned line defects: the defect level was determined by examing a 200 square inch sample. High = 20 or more defects per sample. Medium = 10-20 defects per sample. Low-medium = 5-9 defects per sample. Low = 2-4 defects per sample

What is claimed is:

1. A process for preparing a toned image useful in a pre-press surprint color proof, said process comprising, in the stated order, the following steps:
    (A) providing a multilayer peel-apart photosensitive element comprising, in order from top to bottom:
        (1) a strippable coversheet which is transparent to actinic radiation,
        (2) a photoadherent layer consisting essentially of:
            (a) an addition polymerizable, ethylenically unsaturated monomer;
            (b) an initiator system activatable by actinic radiation;
            (c) an organic polymeric binder; and
            (d) about 3% to about 15% by weight of at least one esterified polyol plasticizer which is an ester of a polyol of two to five carbon atoms and one or more aliphatic saturated organic acids;
        (3) an essentially nonphotosensitive, tonable organic contiguous layer; and
        (4) a removable support sheet;
    wherein after imagewise exposure to actinic radiation, the coversheet may be peeled from the element with the exposed areas of the photoadherent layer adhering thereto, while the unexposed areas of the photoadherent layer remain on the contiguous layer, and wherein the contiguous layer may be toned with a toning material under a set of conditions whereunder the unexposed areas of the photoadherent layer do not accept toner;
    (B) exposing the element to actinic radiation through an image-bearing transparency;
    (C) peeling the strippable coversheet from the photoadherent layer;
    (D) applying a toning material to the surface of the photoadherent layer;
    (E) removing excess toning material;
    whereby a toned negative image is formed having a reduced number of fine toned line defects.

2. A process of claim 1 wherein the photoadherent layer comprises
    about 5 to about 7% by weight of the plasticizer.

3. A process of claim 1 wherein the photoadherent layer comprises a plasticizer selected from the group consisting of:
    the mono-, di- and triacetate esters of glycerol, the mono-, di-, and tri-propionate esters of glycerol, and the mono-, di- and tri-butyrate esters of glycerol.

4. A process of claim 2 wherein the photoadherent layer comprises a plasticizer selected from the group consisting of the mono-, di- and triacetate esters of glycerol, the mono-, di-, and tri-propionate esters of glycerol, and the mono-, di- and tri-butyrate esters of glycerol.

5. A process of claim 1 wherein the photoadherent layer comprises a plasticizer which is a fully esterified polyol.

6. A process of claim 2 wherein the photoadherent layer comprises a plasticizer which is a fully esterified polyol.

7. A process of claim 1 wherein the photoadherent layer comprises a plasticizer selected from the group consisting of triacetin and tributyrin.

8. A process of claim 2 wherein the photoadherent layer comprises a plasticizer selected from the group consisting of triacetin and tributyrin.

9. A process of claim 1 wherein the photoadherent layer comprises about 30-50% by weight of binder, about 30-50% monomer, about 2-8% initiator system, and about 3 to about 15% by weight of esterified polyol plasticizer.

10. A process of claim 1 wherein, before the element is exposed in step (B), the removable support sheet is stripped from the element and the element, minus the removable support, is laminated to a receptor, and further comprising the additional steps of:
    (F) stripping the removable support sheet from an additional multilayer peel-apart photosensitive element as described in step (A) above, and adhering the element, minus the support sheet, to the toned image formed in steps (D) and (E) above;
    (G) exposing the additional element to actinic radiation through a different image-bearing transparency;
    (H) peeling the strippable coversheet from the photoadherent layer; and
    (I) applying a different toning material to the surface of the photoadherent layer;
    (J) removing excess toning material; and,
    (K) optionally, carrying out steps (F) to (J) one or more times, each time exposing through a different image-bearing transparency and applying a different toning material material.

11. A process of claim 10, wherein each element is exposed using a different color separation transparency of a colored image to be reproduced, and wherein each element is colored with the correspondingly colored toning material, to form a multilayer, multicolored surprint proof.

12. A process of claim 11, wherein the photoadherent layer comprises a plasticizer selected from the group consisting of the mono-, di- and triacetate esters of glycerol, the mono-, di-, and tri-propionate esters of glycerol, and the mono-, di- and tributyrate esters of glycerol.

13. A process of claim 11, wherein the photoadherent layer of the photosensitive element comprises about 5 to about 7% by weight of the plasticizer.

14. A process of claim 13, wherein the photoadherent layer of the photosensitive element comprises a plasticizer selected from the group consisting of the mono-, di- and triacetate esters of glycerol, the mono-, di-, and tri-propionate esters of glycerol, and the mono-, di- and tributyrate esters of glycerol.

15. A process of claim 14, wherein the photoadherent layer comprises a plasticizer selected from the group consisting of triacetin and tributyrin.

16. A process of claim 11, wherein the plasticizer is a fully esterified polyol.

17. A process of claim 11 wherein the photoadherent layer comprises about 30-50% by weight binder, 30-50% by weight monomer, 2-8% initiator system and about 3 to about 15% by weight of the esterified polyol plasticizer.

18. A process of claim 11 wherein the coversheet of the photosensitive element is an electric discharge treated polyethylene terephthalate film.

19. A multilayer peel-apart photosensitive element comprising, in order from top to bottom:
(1) a strippable coversheet which is transparent to actinic radiation,
(2) a photoadherent layer consisting essentially of:
  (a) an addition polymerizable, ethylenically unsaturated monomer;
  (b) an initiator system activatable by actinic radiation;
  (c) an organic polymeric binder; and
  (d) about 3% to about 15% by weight of at least one esterified polyol plasticizer which is an ester of a polyol of two to five carbon atoms and one or more aliphatic saturated organic acids;
(3) an essentially nonphotosensitive, tonable organic contiguous layer; and
(4) a support sheet;
wherein after imagewise exposure to actinic radiation, the coversheet may be peeled from the element with the exposed areas of the photoadherent layer adhering thereto, while the unexposed areas of the photoadherent layer remain on the contiguous layer, and wherein the contiguous layer may be toned with a toning material under a set of conditions whereunder the unexposed areas of the photoadherent layer do not accept toner.

20. An element of claim 19 wherein the photoadherent layer comprises about 5 to about 7% by weight of the esterified polyol plasticizer.

21. An element of claim 19 wherein the photoadherent layer comprises an esterified polyol plasticizer selected from the group consisting of: the mono-, di- and triacetate esters of glycerol, the mono-, di-, and tri-propionate esters of glycerol, and the mono-, di- and tributyrate esters of glycerol.

22. An element of claim 20 wherein the photoadherent layer comprises an esterified polyol plasticizer selected from the group consisting of the mono-, di- and triacetate esters of glycerol, the mono-, di-, and tri-propionate esters of glycerol, and the mono-, di- and tributyrate esters of glycerol.

23. An element of claim 19 wherein the photoadherent layer comprises an esterified polyol plasticizer which is a fully esterified polyol.

24. An element of claim 20 wherein the photoadherent layer comprises an esterified polyol plasticizer which is a fully esterified polyol.

25. An element of claim 19 wherein the photoadherent layer comprises an esterified polyol plasticizer selected from the group consisting of triacetin and tributyrin.

26. An element of claim 20 wherein the photoadherent layer comprises an esterified polyol plasticizer selected from the group consisting of triacetin and tributyrin.

27. An element of claim 19 wherein the photoadherent layer comprises about 30-50% by weight of binder, about 30-50% monomer, about 2-8% initiator system, and about 3 to about 15% by weight of an esterified polyol plasticizer.

* * * * *